United States Patent
Ueno

(10) Patent No.: US 9,972,715 B2
(45) Date of Patent: May 15, 2018

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventor: Katsunori Ueno, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days. days.

(21) Appl. No.: 15/219,301

(22) Filed: Jul. 26, 2016

(65) Prior Publication Data

US 2017/0092758 A1 Mar. 30, 2017

(30) Foreign Application Priority Data

Sep. 28, 2015 (JP) .................................. 2015-190046

(51) Int. Cl.
*H01L 29/76* (2006.01)
*H01L 29/78* (2006.01)
(Continued)

(52) U.S. Cl.
CPC ...... *H01L 29/7813* (2013.01); *H01L 29/1095* (2013.01); *H01L 29/1608* (2013.01);
(Continued)

(58) Field of Classification Search
CPC ............. H01L 29/7813; H01L 29/1095; H01L 29/1608; H01L 29/2003; H01L 29/66068;
(Continued)

(56) References Cited

U.S. PATENT DOCUMENTS 6,084,264 A   7/2000  Darwish
6,465,843 B1  10/2002 Hirler et al.
(Continued)

FOREIGN PATENT DOCUMENTS

JP    2010-283368 A   12/2010
JP    4678902 B2       2/2011

OTHER PUBLICATIONS

"Vertical GaN-based trench metal oxide semiconductor field-effect transistors on a free-standing GaN substrate with blocking voltage of 1.6 kV," Tohru Oka et al., Applied Physics Express 7, 021002 (2014).

(Continued)

*Primary Examiner* — Kevin M Picardat

(57) ABSTRACT

To more easily form a structure that mitigates the electrical field focus at the bottom portion of the trench gate and prevents decreases and variations in the gate threshold value ($V_{th}$), provided is a semiconductor device including a semiconductor substrate; a second semiconductor region with a second conduction type that is provided above the semiconductor substrate and includes a first semiconductor region with a first conduction type in a portion thereof; a third semiconductor region that is provided above the second semiconductor region and has a higher second conduction type impurity concentration than the second semiconductor region; and a gate trench that penetrates through the third semiconductor region and is provided on top of the first semiconductor region. The gate trench includes a gate insulating film provided on side walls and a bottom portion of the gate trench and a gate electrode provided in contact with the gate insulating film.

10 Claims, 21 Drawing Sheets

(51) Int. Cl.
*H01L 29/16* (2006.01)
*H01L 29/20* (2006.01)
*H01L 29/10* (2006.01)
*H01L 29/66* (2006.01)

(52) U.S. Cl.
CPC .... *H01L 29/2003* (2013.01); *H01L 29/66068* (2013.01); *H01L 29/66734* (2013.01)

(58) Field of Classification Search
CPC ........... H01L 29/4236; H01L 29/42352; H01L 29/42336; H01L 29/66613–29/66628; H01L 29/7825; H01L 29/7802–29/7815; H01L 29/66712–29/66734; H01L 2007/11866; H01L 21/823828–21/82385; H01L 27/2454
USPC .......................................... 257/77, 330, 328
See application file for complete search history.

(56) References Cited

U.S. PATENT DOCUMENTS

| | | | | |
|---|---|---|---|---|
| 6,927,451 | B1* | 8/2005 | Darwish | H01L 29/1095 |
| | | | | 257/330 |
| 7,504,306 | B2* | 3/2009 | Sapp | H01L 29/7827 |
| | | | | 438/270 |
| 8,710,585 | B1* | 4/2014 | Hu | H01L 29/36 |
| | | | | 257/330 |
| 9,136,335 | B2* | 9/2015 | Taketani | H01L 21/28211 |
| 9,343,528 | B2* | 5/2016 | Roig Guitart | H01L 29/0634 |
| 2005/0167742 | A1* | 8/2005 | Challa | H01L 21/3065 |
| | | | | 257/328 |
| 2008/0246081 | A1* | 10/2008 | Li | H01L 29/1095 |
| | | | | 257/331 |
| 2012/0037920 | A1 | 2/2012 | Treu et al. | |
| 2012/0068262 | A1* | 3/2012 | Pan | H01L 29/66734 |
| | | | | 257/332 |
| 2015/0053999 | A1* | 2/2015 | Kumagai | H01L 29/0615 |
| | | | | 257/77 |
| 2016/0020289 | A1 | 1/2016 | Nakano et al. | |
| 2017/0069727 | A1* | 3/2017 | Blanchard | H01L 29/7813 |

OTHER PUBLICATIONS

"High Performance SiC Trench Devices with Ultra-Low Ron," T. Nakamura et al., 26.5.1-26.5.3, IEDM 2011.
Office Action issued for counterpart Japanese Application 2015-190046, issued by the Japan Patent Office dated Jun. 28, 2016.

\* cited by examiner

S10

S20

S60

S70

S14

S20

S40

SEMICONDUCTOR DEVICE AND SEMICONDUCTOR DEVICE MANUFACTURING METHOD

The contents of the following Japanese patent application are incorporated herein by reference:
NO. 2015-190046 filed in JP on Sep. 28, 2015.

BACKGROUND

1. Technical Field

The present invention relates to a semiconductor device and a semiconductor device manufacturing method.

2. Related Art

Conventionally, a vertical MOSFET (Metal-Oxide-Semiconductor Field-Effect-Transistor) is known that includes a trench gate, as shown in Non-Patent Document 1, for example. In order to mitigate the electric field concentration at the bottom portion of the trench gate, a source trench having a p-type region is provided at a position deeper than the bottom portion of the gate trench, as shown in Non-Patent Document 2, for example. Furthermore, ion injection is performed on the bottom portion and the side walls of the gate trench provided in the p-type base region to form an n-type region, as shown in Patent Document 1, for example.

PRIOR ART DOCUMENTS

Non-Patent Document 1: "Vertical GaN-based trench metal oxide semiconductor field-effect transistors on a freestanding GaN substrate with blocking voltage of 1.6 kV," Tohru Oka et al., Applied Physics Express 7, 021002 (2014)

Non-Patent Document 2: "High Performance SiC Trench Devices with Ultra-Low Ron," T. Nakamura et al., 26.5.1-26.5.3, IEDM 2011

Patent Document 1: Japanese Patent No. 4678902

In the case of Non-Patent Document 2, in order to form the p-type region of the bottom portion of the source trench, it is necessary to inject p-type impurities into the source trench and to perform thermal processing at a high temperature of 1,500° C. or more. Therefore, in a case where the gate trench and the source trench are formed at the same time, the surfaces of the trench and the semiconductor substrate are damaged due to the high-temperature thermal processing. If the gate trench and the source trench are formed during different steps in order to avoid this damage, the manufacturing process becomes complicated and it becomes difficult to realize good I-V characteristics. Furthermore, in the case of Patent Document 1, the bottom portion and the side walls of the gate trench provided in the p-type base region are counter-doped with n-type impurities, and therefore there is a problem that the gate threshold value ($V_{th}$) of the MOSFET decreases or becomes more varied.

Therefore, it is a purpose of the present invention to more easily form a structure that mitigates the electrical field focus at the bottom portion of the trench gate and prevents decreases and variations in the gate threshold value ($V_{th}$).

SUMMARY

According to a first aspect of the present invention, provided is a semiconductor device comprising a semiconductor substrate, a second semiconductor region with a second conduction type, a third semiconductor region with the second conduction type, and a gate trench. The second semiconductor region may be provided above the semiconductor substrate. The second semiconductor region may include a first semiconductor region with a first conduction type in a portion thereof. The third semiconductor region may be provided above the second semiconductor region. The third semiconductor region may have a higher second conduction type impurity concentration than the second semiconductor region. The gate trench may penetrate through the third semiconductor region. The gate trench may be provided on top of the first semiconductor region. The gate trench may include a gate insulating film provided on side walls and a bottom portion of the gate trench and a gate electrode provided in contact with the gate insulating film.

The bottom portion of the gate trench may be provided in direct contact with the first semiconductor region.

Width of the gate trench may be equal to width of the first semiconductor region.

Width of the gate trench may be greater than width of the first semiconductor region.

Width of the gate trench may be less than width of the first semiconductor region.

The width of the first semiconductor region may extend from a bonding interface between the second semiconductor region and the third semiconductor region toward the semiconductor substrate side.

The bottom portion of the gate trench may be provided lower than a bonding interface between the second semiconductor region and the third semiconductor region. The first semiconductor region may have a portion that contacts the side walls of the gate trench.

The first semiconductor region may have a top portion that extends along the bonding interface.

In the second semiconductor region, the second conduction type impurity concentration may decrease from the bonding interface toward the semiconductor substrate side.

The semiconductor device may further comprise a source trench. The source trench may penetrate through the third semiconductor region. The source trench may be provided at a position differing from a position of the gate trench. The source trench may include electrode material.

The semiconductor device may further comprise an embedded region. The embedded region may be provided at a distance from the source trench below the source trench. The embedded region may have a second conduction type impurity concentration that is higher than a second conduction type impurity concentration of the third semiconductor region.

The semiconductor substrate may be either a silicon carbide or nitride semiconductor.

The semiconductor device may be used as a power semiconductor device with high withstand voltage.

A semiconductor device manufacturing method comprises epitaxially forming a second semiconductor region with a second conduction type on a semiconductor substrate; epitaxially forming, on top of the second semiconductor region, a third semiconductor region that has a higher second conduction type impurity concentration than the second semiconductor region; forming a gate trench that penetrates through the third semiconductor region; forming a first semiconductor region with a first conduction type in a portion of the second semiconductor region; and forming a gate insulating film on side walls and a bottom portion of the gate trench and forming a gate electrode in contact with the gate insulating film.

The forming the first semiconductor region may include forming the first semiconductor region by injecting impurities with the first conduction type into the portion of the second semiconductor region.

The first semiconductor region may be formed after forming the gate trench. Forming the first semiconductor region may include forming the first semiconductor region with the first conduction type in the portion of the second semiconductor region through the gate trench.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

In this Specification, n and p refer to carriers that respectively have a large number of electrons and a large number of positive holes. Furthermore, concerning the + and − signs written to the upper right of n and p, + means that the carrier concentration is higher than in a case where no sign is written, and − means that the carrier concentration is lower than in a case where no sign is written. In the example in this Specification, the first conduction type is n-type and the second conduction type is p-type. However, in other examples, the first conduction type may be p-type and the second conduction type may be n-type. Furthermore, in this Specification, E indicates a power of 10, e.g. 1E+16 means $1 \times 10^{16}$.

Figure 1:
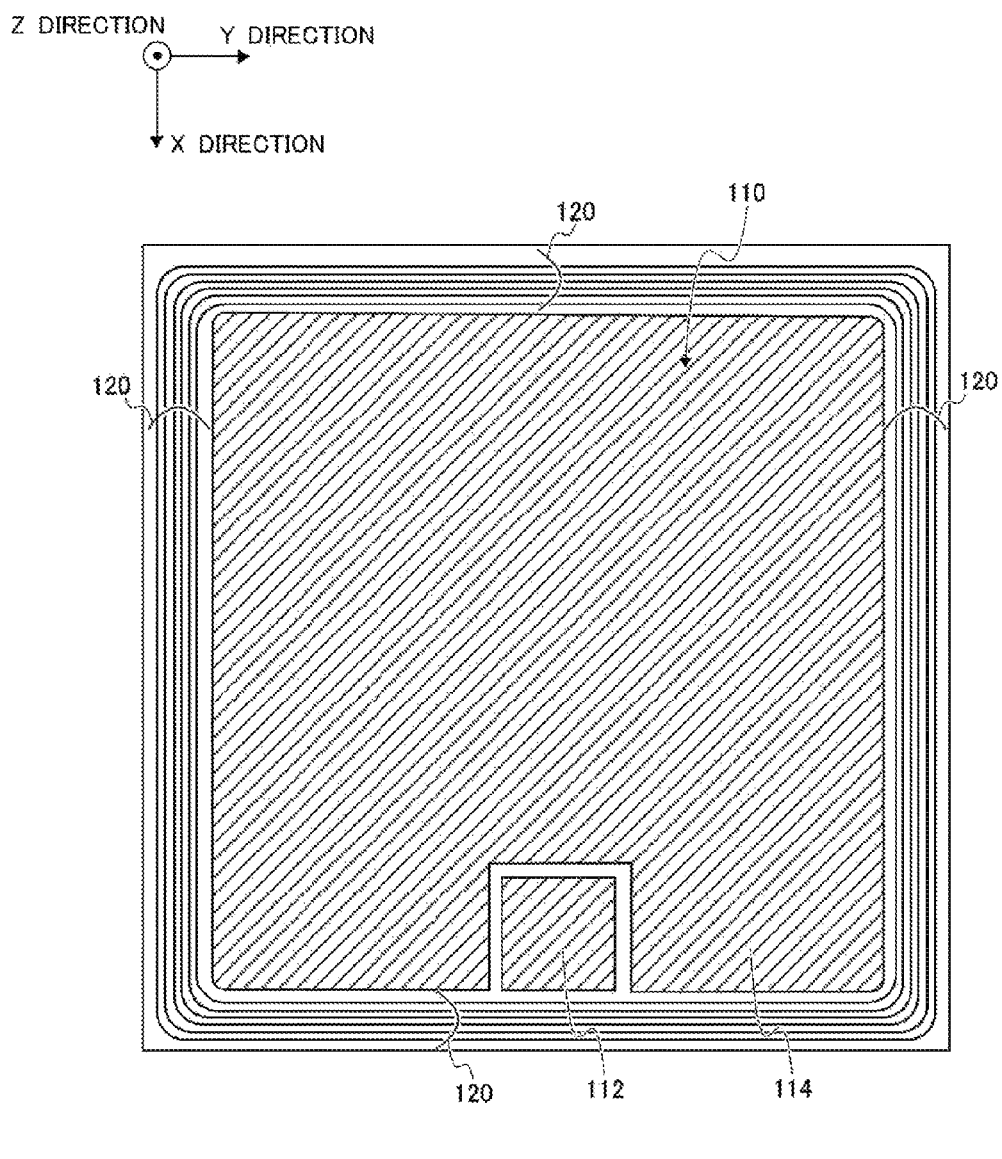
FIG. 1 is a schematic view of a top surface of a semiconductor device 100.

FIG. 1 is a schematic view of a top surface of a semiconductor device 100. The semiconductor device 100 may be a semiconductor device that is used as a power semiconductor device with high withstand voltage. In this Specification, "high withstand voltage" may mean a withstand voltage greater than or equal to 100 V or a withstand voltage greater than or equal to 600 V.

In this Specification, the X direction and the Y direction are perpendicular to each other, and the Z direction is perpendicular to the X-Y plane. The X direction, the Y direction, and the Z direction form a so-called right hand system. The semiconductor device 100 in this example has a front surface facing the +Z direction and a back surface facing the −Z direction. In this example, the front surface is the surface on which a source electrode 50 described further below is provided, and the back surface is the surface on which a drain electrode 60 described further below is provided.

The semiconductor device 100 in this example includes an active region 110 and a peripheral region 120. A gate pad 112 and a source pad 114 are provided on the front surface side of the active region 110. The gate pad 112 and the source pad 114 are electrodes that are respectively electrically connected to a gate electrode 48 and a source electrode 50 described further below.

The peripheral region 120 has a withstand voltage structure. The withstand voltage structure may be a guard ring. The withstand voltage structure may include a field plate in addition to a guard ring. The withstand voltage structure may have a function to prevent the focusing of the electrical field at the active region 110 by having the depletion layer generated by the active region 110 extend to the peripheral region 120.

Figure 2:
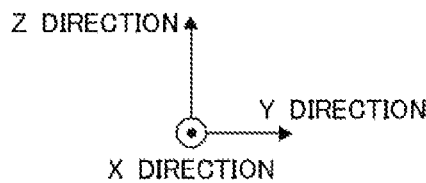
FIG. 2 shows a cross section of the active region 110 according to a first embodiment in the Y-Z plane.
Figure 2:
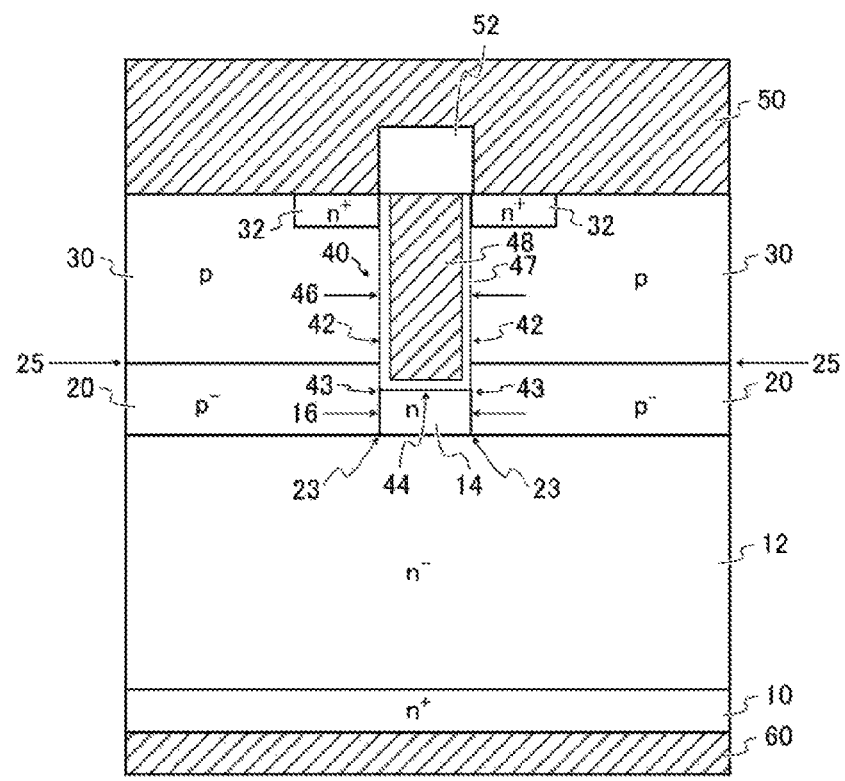

FIG. 2 shows a cross section of the active region 110 according to a first embodiment in the Y-Z plane. FIG. 2 shows a unit cell of the semiconductor device 100. The length of the unit cell in the Y direction may be approximately 10 μm. The semiconductor device 100 includes an $n^+$-type substrate 10 serving as a semiconductor substrate, an $n^-$-type region 12, a $p^-$-type region 20 serving as a second semiconductor region, a p-type region 30 serving as a third semiconductor region, a source electrode 50, and a drain electrode 60.

The $n^+$-type substrate 10 may be either a silicon carbide (SiC) or nitride semiconductor. If the $n^+$-type substrate 10 is SiC, the n-type impurities may be one or more types of element from among nitrogen (N) and phosphorus (P), and the p-type impurities may be one or more types of element from among aluminum (Al) and boron (B). The nitride semiconductor may be gallium nitride (GaN). If the $n^+$-type substrate 10 is GaN, the n-type impurities may be one or more types of element from among oxygen (O) and silicon (Si), and the p-type impurities may be one or more types of element from among magnesium (Mg) and beryllium (Be).

The $n^-$-type region 12 is provided on top of and in contact with the $n^+$-type substrate 10. In this Specification, the terms "above," "upward," and "higher" refer to the +Z direction. Furthermore, the terms "below," "downward," and "lower" refer to the −Z direction. The n⁻-type region 12 functions as a drift region in which the carriers move. The thickness and impurity concentration of the n⁻-type region 12 may be suitably determined according to the withstand voltage of the semiconductor device 100. The n⁻-type region 12 may have a thickness of 10 μm and may have an n-type impurity concentration that is approximately greater than or equal to $1E+16$ cm$^{-3}$ and less than or equal to $1E+17$ cm$^{-3}$.

The p⁻-type region 20 is provided above the n⁺-type substrate 10. The p⁻-type region 20 in this example is provided on top of and in contact with the n⁻-type region 12. The p⁻-type region 20 may have a thickness that is greater than or equal to 0.3 μm and less than or equal to 1.5 μm and may have a p-type impurity concentration that is greater than or equal to $5E+15$ cm$^{-3}$ and less than or equal to $1E+17$ cm$^{-3}$.

The p⁻-type region 20 includes an n-type region 14 serving as a first semiconductor region with a first conduction type in a portion thereof. The n-type region 14 in this example is formed by injecting n-type impurities into the p⁻-type region 20. The p⁻-type region 20 has a p-type impurity concentration that is lower than the p-type impurity concentration of a p-type region 30 described further below. Therefore, when counter-doping, it is possible to lower the injected n-type impurity concentration to a greater degree than when injecting the n-type impurities into the p-type region 30. In other words, the amount of counter-doping with n-type impurities is reduced, and therefore the counter-doping can be performed more easily. The n-type region 14 may have an n-type impurity concentration that is approximately greater than or equal to $6E+15$ cm$^{-3}$ and less than or equal to $3E+17$ cm$^{-3}$.

The p⁻-type region 20 is provided with a portion of the gate trench 40 that protrudes further downward than a bonding interface 25 between the p⁻-type region 20 and the p-type region 30. The gate trench 40 is provided on top of the n-type region 14. The bottom portion 44 of the gate trench 40 in this example is provided in direct contact with the n-type region 14. The length of the gate trench 40 that protrudes from the bonding interface 25 toward the p⁻-type region 20 may be any length that enables the n-type region 14 to be provided within the p⁻-type region 20. In this example, the length of the gate trench 40 protruding from the bonding interface 25 is greater than or equal to 0.1 μm and less than or equal to 0.5 μm. In this case, the thickness of the p⁻-type region 20 that is lower than the bottom portion 44 may be greater than or equal to 0.2 μm and less than or equal to 1 μm.

In this example, the width 46 of the gate trench 40 is equal to the width 16 of the n-type region 14. In other words, the entirety of the p⁻-type region 20 that is below the bottom portion 44 of the gate trench 40 is the n-type region 14. The width 46 of the gate trench 40 refers to the length of the gate trench 40 in the Y direction. The gate trench 40 has side walls 42 parallel to the Z direction, and therefore the width 46 of the gate trench 40 is substantially constant along the Z direction. Furthermore, the width 16 of the n-type region 14 in this example is the length of the n-type region 14 in the Y direction within the p⁻-type region 20.

The p-type region 30 is provided on top of the p⁻-type region 20. The p-type region 30 has a p-type impurity concentration that is higher than the p-type impurity concentration of the p⁻-type region 20. The p-type region 30 is provided with the gate trench 40 that penetrates through the p-type region 30 and reaches the n-type region 14. The p-type region 30 may have a thickness of approximately 1.5 μm and may have an impurity concentration of approximately greater than or equal to $5E+16$ cm$^{-3}$ and less than or equal to $5E+17$ cm$^{-3}$. The p-type region 30 includes a source region 32 at a position in contact with the gate trench 40 on the source electrode 50 side. The source region 32 has n⁺-type impurities.

The gate trench 40 includes a gate insulating film 47 and a gate electrode 48. The gate insulating film 47 is provided on the side walls 42 and the bottom portion 44 of the gate trench 40. The gate electrode 48 is provided within the gate trench 40 and in contact with the gate insulating film 47. An inter-layer insulating film 52 that electrically isolates the gate electrode 48 and the source electrode 50 from each other is provided above the gate trench 40.

When the gate electrode 48 is in the ON state (in this example, when a prescribed positive potential is applied to the gate electrode 48), a charge inversion layer is formed in the p-type region 30 near the side walls 42. At this time, when a prescribed potential difference is formed between the source electrode 50 and the drain electrode 60, current flows from the drain electrode 60 to the source electrode 50 via the n-type region 14, the charge inversion layer, and the source region 32.

When the gate electrode 48 is in the OFF state (in this example, when a prescribed negative potential or a zero potential is applied to the gate electrode 48), the p⁻-type region 20 and the p-type region 30 have approximately the same potential as the source electrode 50. At this time, the electrical field is focused at a p-n junction portion that is not a planar junction. In this example, the electrical field is focused at p-n junction portions shaped as right angles, i.e. corners 23 that are the p-n junction portion between the n-type region 14 and the p⁻-type region 20.

Generally, the breakdown voltage of the p-n junctions is lower than the breakdown voltage of the gate insulating film 47. Therefore, breakdown at a time when the gate electrode 48 is in the OFF state occurs at the corners 23 of the p-n junction portion of the n-type region 14 and not at the corners 43 of the bottom portion 44 of the gate trench 40. In this way, in this example, the corners 23 break down at a lower voltage, and therefore it is possible to prevent the breakdown of the bottom portion 44 of the gate trench 40. Therefore, it is possible to prevent insulation breakdown of the gate insulating film 47.

Furthermore, since breakdown occurs at the corners 23 of the n-type region 14 and not at the corners 43 of the bottom portion 44, it is possible to distance the breakdown occurrence location farther from the source region 32. Therefore, compared to a case in which breakdown occurs at the corners 43 of the bottom portion 44, it is possible to more reliably prevent a breakdown current from flowing to the source region 32 and turning ON the parasitic PNP transistor.

Figure 3:
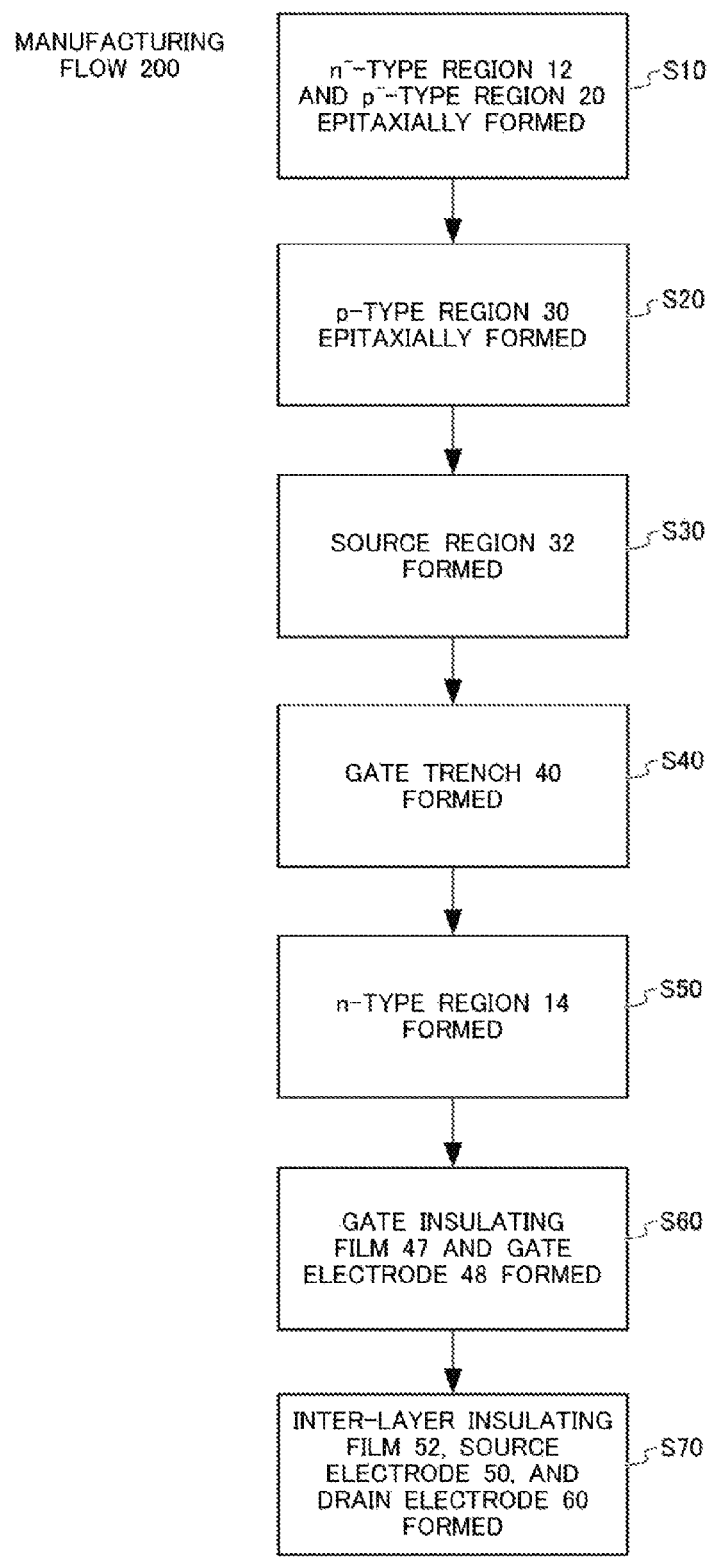
FIG. 3 shows a manufacturing flow 200 for manufacturing the semiconductor device 100 according to the first embodiment.

FIG. 3 shows a manufacturing flow 200 for manufacturing the semiconductor device 100 according to the first embodiment. In this example, steps S10 to S70 are performed in the stated order. Known techniques may be used for the epitaxial formation process, the etching process, the ion injection process, and the like.

Figure 4A:
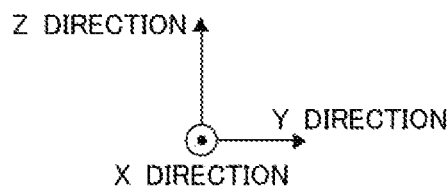
FIG. 4A shows a step (S10) for forming the $n^-$-type region 12 and the $p^-$-type region 20.
Figure 4A:
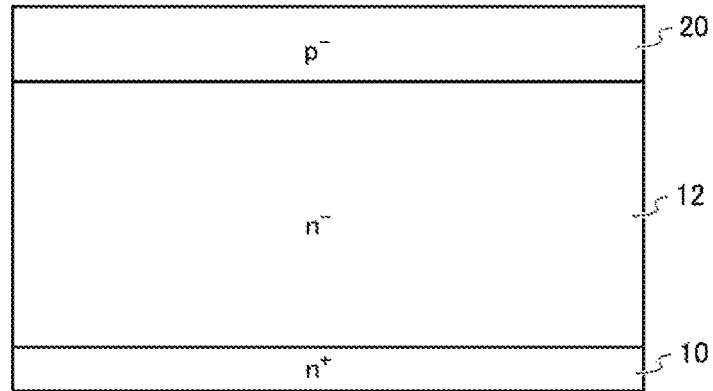

FIG. 4A shows a step (S10) for forming the n⁻-type region 12 and the p⁻-type region 20. In this example, the n⁻-type region 12 is epitaxially formed on top of the n⁺-type substrate 10, and then the p⁻-type region 20 is epitaxially formed.

Figure 4B:
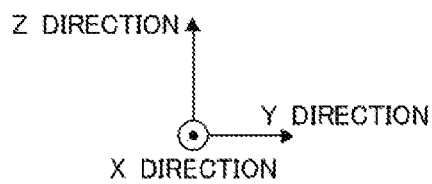
FIG. 4B shows a step (S20) for forming the p-type region 30.
Figure 4B:
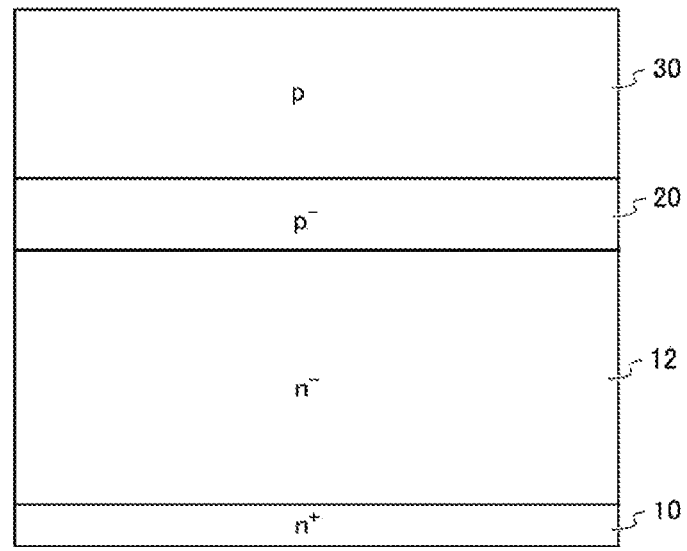

FIG. 4B shows a step (S20) for forming the p-type region 30. The p-type region 30, which has a higher p-type impurity concentration than the p⁻-type region 20, is epitaxially formed on top of the p⁻-type region 20.

Figure 4C:
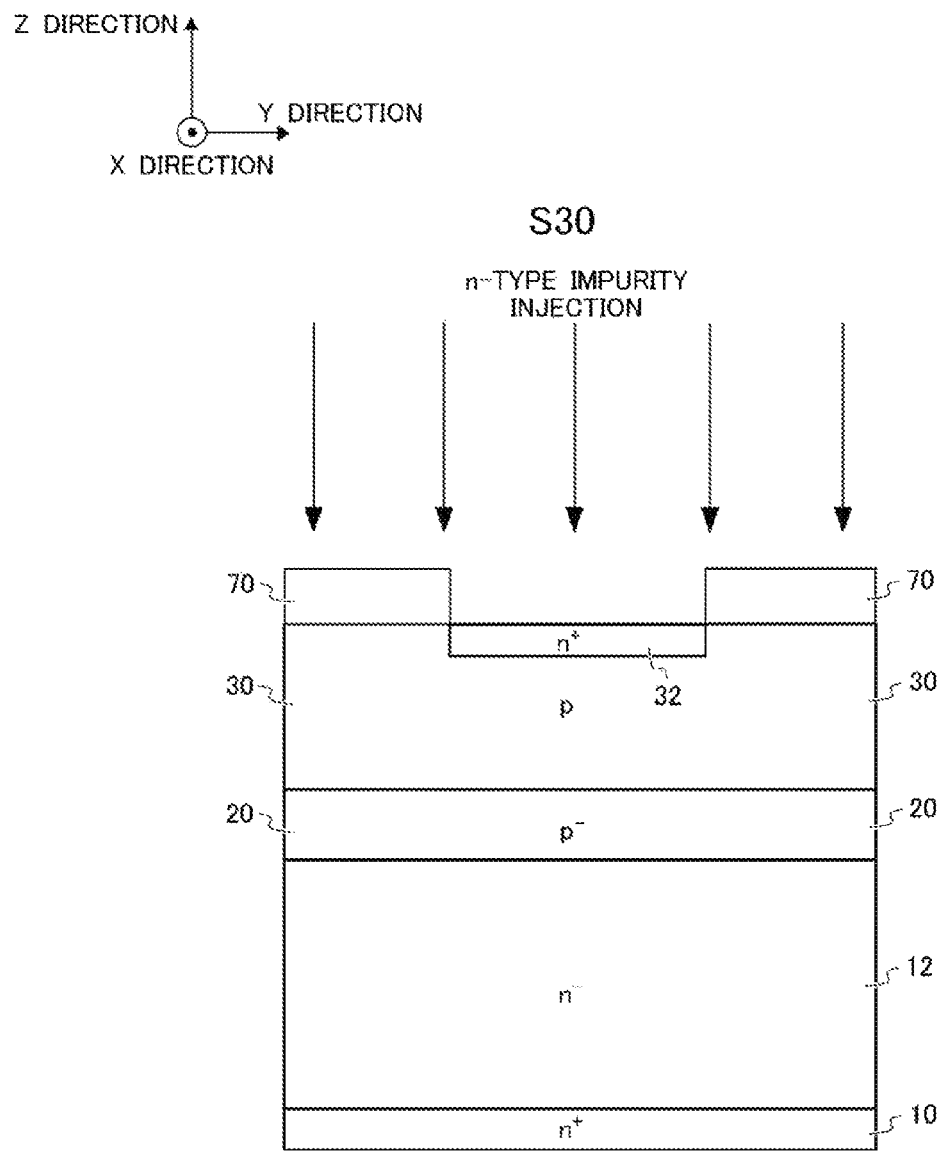
FIG. 4C shows a step (S30) for forming the source region 32.

FIG. 4C shows a step (S30) for forming the source region 32. Here, n-type impurities are injected into a portion of the p-type region 30 from the front surface, using a patterned photoresist as a mask material 70. In this example, the source region 32 is formed to have an impurity concentration of 1E+19 cm$^{-3}$ and a depth of approximately 0.3 μm.

The source region 32 is in an amorphous state after the impurity injection, and therefore deteriorates easily during the following processes (chemical etching, oxidization, or the like). Therefore, after the impurity injection, the entire layered structure including the source region 32 may be thermally processed at a temperature of 1,300° C. or less. By performing thermal processing after the impurity injection, the crystallinity of the source region 32 can be restored, and therefore it is possible to prevent degradation of the source region 32 during the following processes. Instead, in order to simplify the manufacturing process, thermal processing may be performed at a step (S50) for forming the n-type region 14 and not performed at the step (S30) for forming the source region 32. In this way, by performing thermal processing on both the source region 32 and the n-type region 14 in a single instance of thermal processing, the manufacturing process of the semiconductor device 100 may be simplified.

Figure 4D:
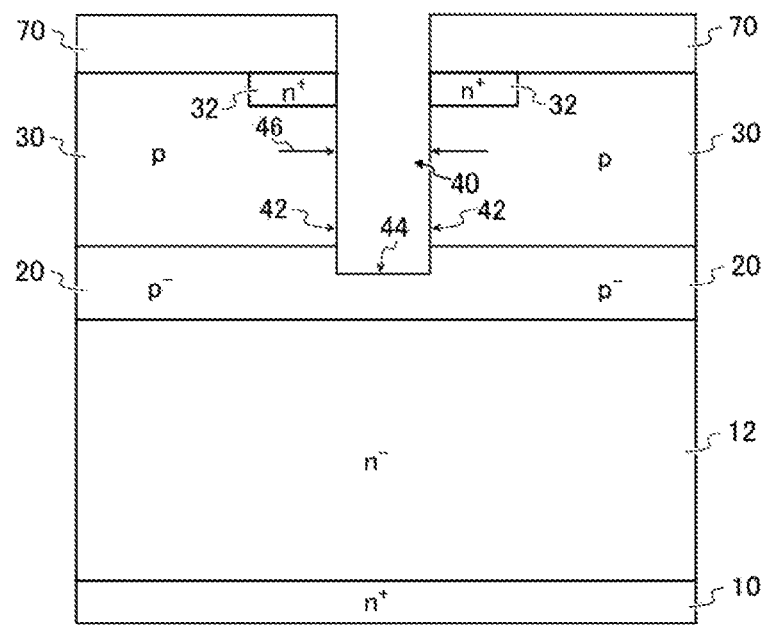
FIG. 4D shows a step (S40) for forming the gate trench 40.

FIG. 4D shows a step (S40) for forming the gate trench 40. In this example, the mask material 70 is formed on regions other than the region where the gate trench 40 is to be formed, and then the entire front surface is etched. In this way, the gate trench 40 is formed penetrating through the p-type region 30. The side walls 42 are formed parallel to the Z direction, and the bottom portion 44 reaches the p⁻-type region 20.

Figure 4E:
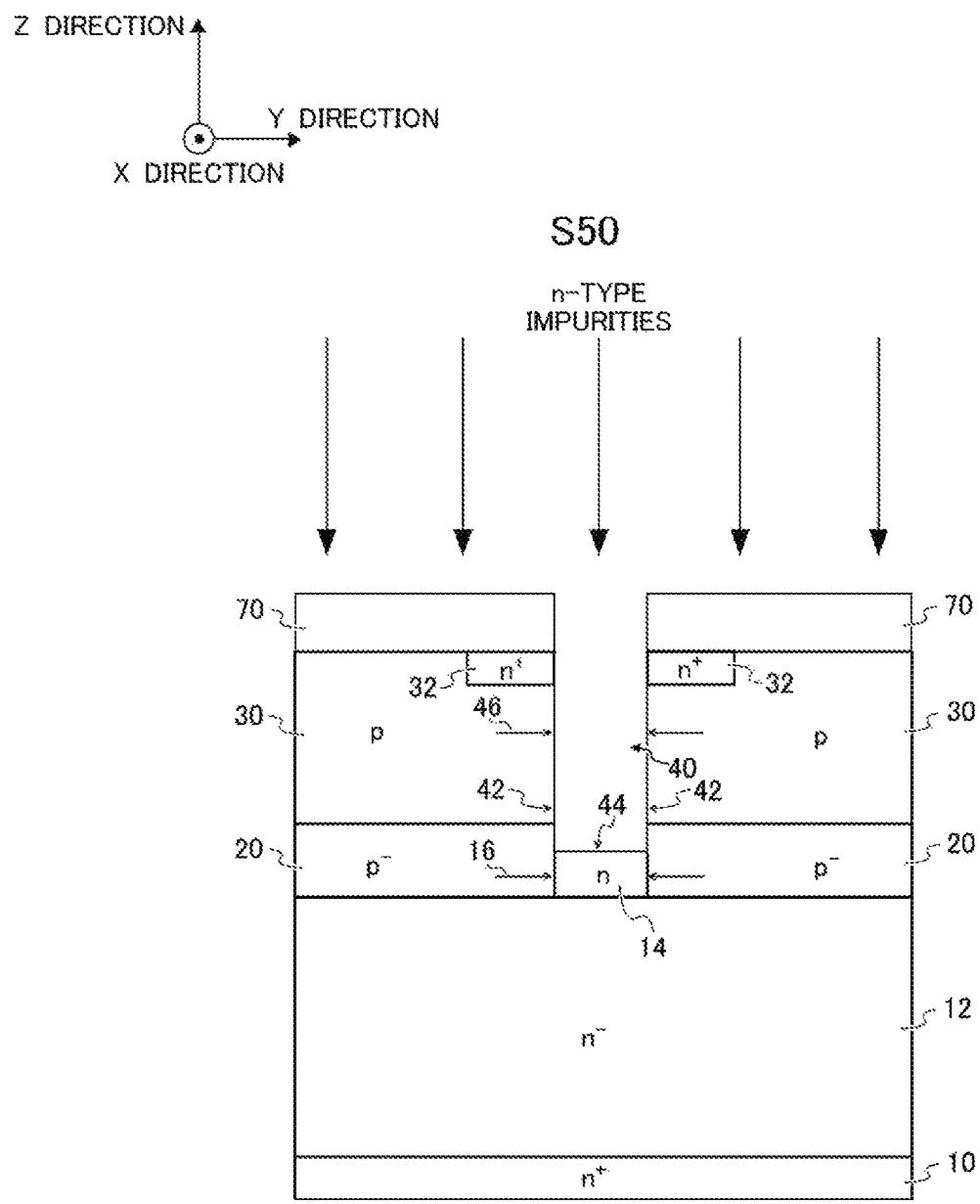
FIG. 4E shows the step (S50) for forming the n-type region 14.

FIG. 4E shows the step (S50) for forming the n-type region 14. At S50, the n-type region 14 is formed by injecting n-type impurities into a portion of the p⁻-type region 20. In this example, the n-type impurities are injected via the gate trench 40 in a direction parallel to the –Z direction. Next, the n-type impurities are activated by performing thermal processing at a temperature of 1,300° C. or less. In this way, the n-type region 14 is formed in the p⁻-type region 20 below the gate trench 40.

In this example, the n-type impurities are injected in a direction approximately parallel to the side walls 42, and therefore n-type impurities are not injected into the side walls 42. Even if n-type impurities are unexpectedly injected into the side walls 42, the amount of n-type impurities injected into the side walls 42 is a very small amount that does not affect the gate threshold value ($V_{th}$). Accordingly, in this example, a decrease and variation in the gate threshold value ($V_{th}$) can be prevented.

The n⁺-type substrate 10 may be an SiC substrate with the "c" surface as the primary surface. In this case, the side walls 42 of the gate trench 40 are the "m" surface and the "a" surface. The "m" surface and the "a" surface have higher mobility compared to other surfaces, and therefore there is no need to inject n-type impurities into the side walls 42. Generally, GaN has higher mobility than SiC, and therefore there is no need to inject n-type impurities into the side wall 42 to further increase mobility when the n⁺-type substrate 10 is a GaN substrate. Therefore, in this example, it is assumed that n-type impurities are not injected into the side walls 42 of the gate trench 40.

In this example, a source trench having a p-type region at a position deeper than the bottom portion 44 of the gate trench 40 is not provided. Therefore, it is possible to form the protective structure of the bottom portion 44 of the gate trench 40 more easily than in the conventional art. In addition, it is possible to use the mask material 70 in both the step (S40) for forming the gate trench 40 and the step (S50) for forming the n-type region 14. Therefore, the manufacturing process can be simplified.

Figure 4F:
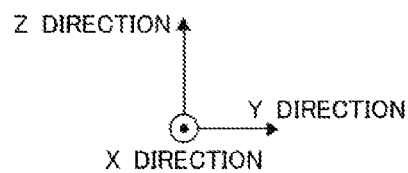
FIG. 4F shows a step (S60) for forming the gate insulating film 47 and the gate electrode 48.
Figure 4F:
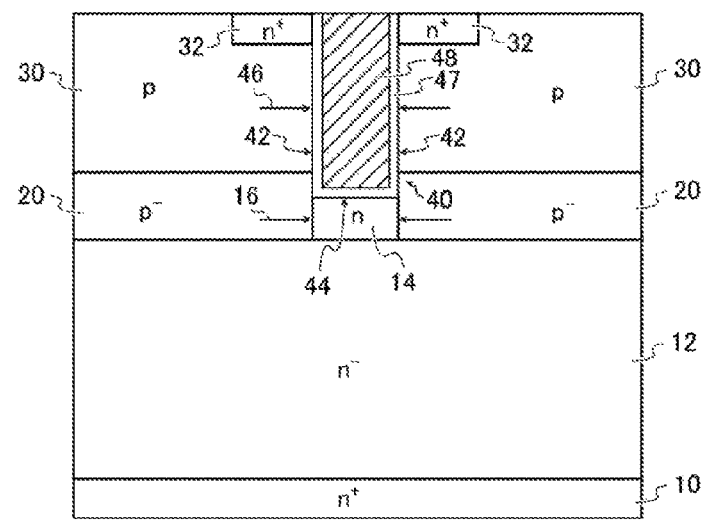

FIG. 4F shows a step (S60) for forming the gate insulating film 47 and the gate electrode 48. At S50, the gate insulating film 47 is formed on the side walls 42 and bottom portion 44 of the gate trench 40. Next, the gate electrode 48 is formed in contact with the gate insulating film 47. The gate insulating film 47 may be silicon oxide with a thickness of 50 nm. The gate electrode 48 may be polysilicon.

Figure 4G:
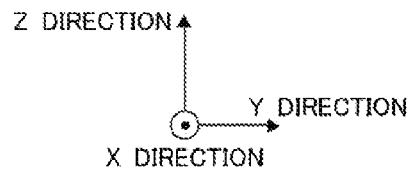
FIG. 4G shows a step (S70) for forming the inter-layer insulating film 52, the source electrode 50, and the drain electrode 60.
Figure 4G:
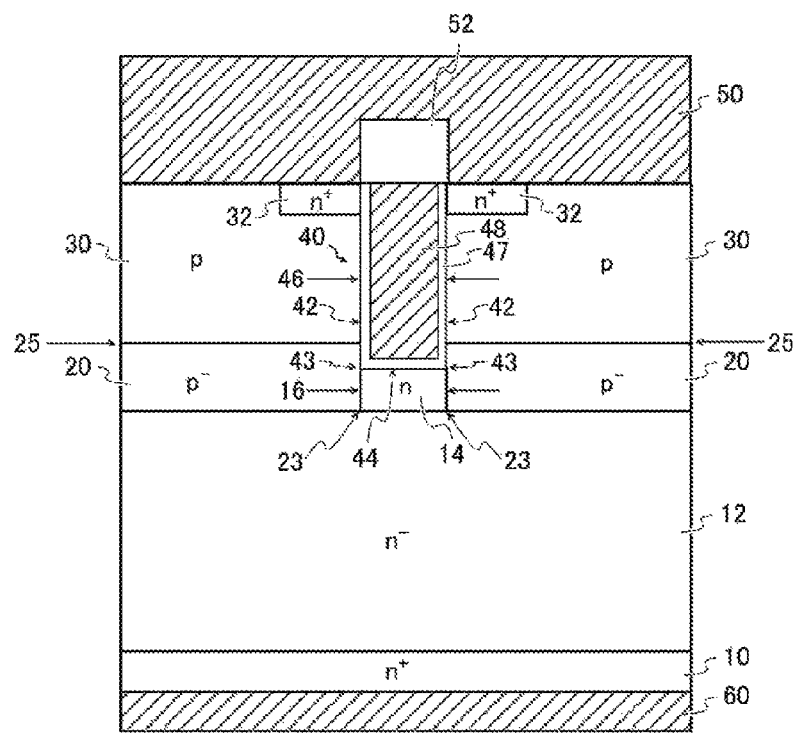

FIG. 4G shows a step (S70) for forming the inter-layer insulating film 52, the source electrode 50, and the drain electrode 60. The inter-layer insulating film 52 may be silicon oxide. The source electrode 50 and the drain electrode 60 may each be layered structures of titanium (Ti) and aluminum (Al). At a region contacting the p-type region 30, the source electrode 50 may further include one or more metals from among nickel (Ni), platinum (Pt), palladium (Pd), tungsten (W), gold (Au), silver (Ag), copper (Cu), tantalum (Ta), and magnesium (Mg).

Figure 5:
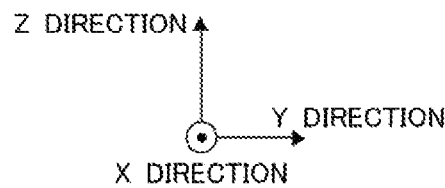
FIG. 5 shows a cross section of an active region 110 according to a second embodiment in the Y-Z plane.
Figure 5:
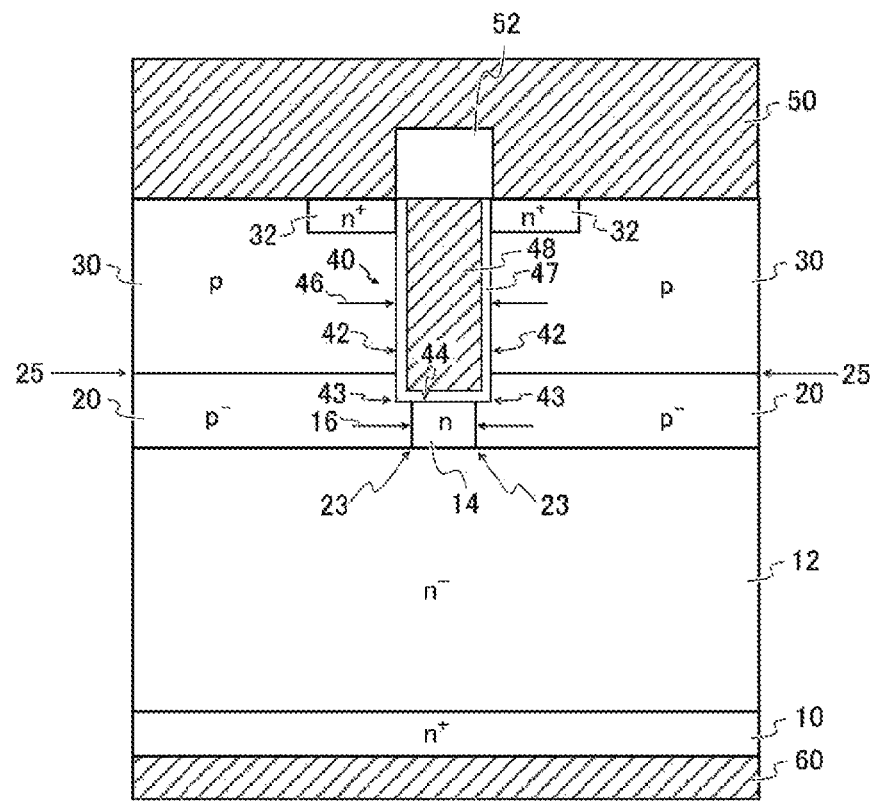

FIG. 5 shows a cross section of an active region 110 according to a second embodiment in the Y-Z plane. FIG. 5 shows a unit cell of the semiconductor device 100. In this example, the width 46 of the gate trench 40 is greater than the width 16 of the n-type region 14. The step (S50) for injecting n-type impurities is performed in a state where an ion injection blocking layer made of insulation is provided on the side walls 42 but no ion injection blocking layer is provided to the bottom portion 44. As a result, it is possible to obtain the n-type region 14 of this example. The second embodiment differs from the first embodiment with regard to this point. Other points are the same as in the first embodiment.

In this example, the p⁻-type region 20 covers the corners 43, and therefore the electrical field at the corners 43 during the OFF state is weaker than the electrical field at the corners 23. As a result, the corners 23 break down at a lower voltage, and therefore the breakdown of the bottom portion 44 of the gate trench 40 can be prevented.

Figure 6:
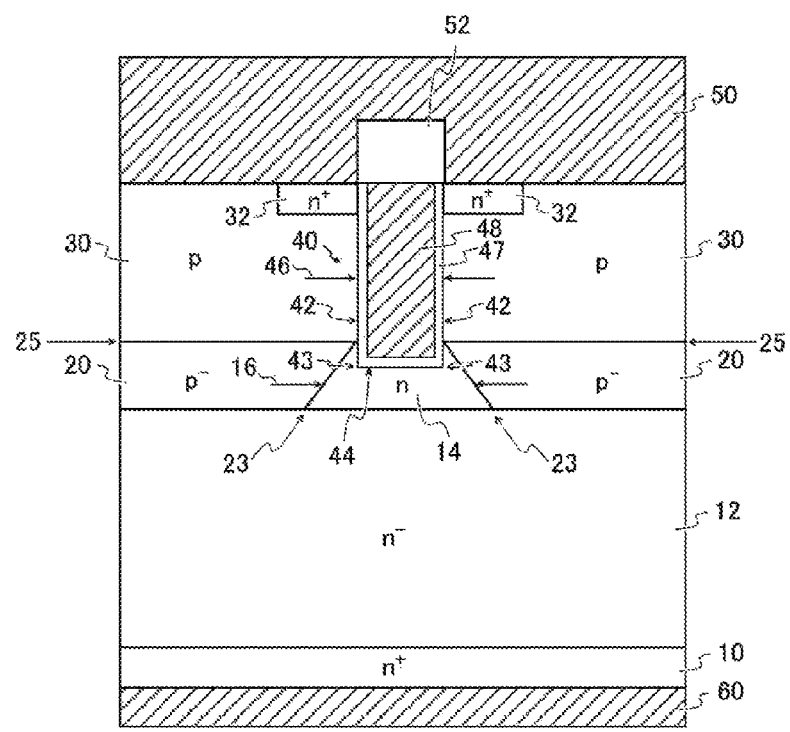
FIG. 6 shows a cross section of an active region 110 according to a third embodiment in the Y-Z plane.

FIG. 6 shows a cross section of an active region 110 according to a third embodiment in the Y-Z plane. FIG. 6 shows a unit cell of the semiconductor device 100. In this example, the width 46 of the gate trench 40 is less than the width 16 of the n-type region 14. Furthermore, the bottom portion 44 of the gate trench 40 is provided farther downward than the bonding interface 25, and therefore a portion of the n-type region 14 contacts the side walls 42 of the gate trench 40. Specifically, the n-type region 14 contacts the portions of the side walls 42 of the gate trench 40 that are between the bottom portion 44 and the bonding interface 25. The third embodiment differs from the first embodiment with regard to these points. Other points are the same as in the first embodiment.

In this example, since the width 16 of the n-type region 14 is greater than in the first embodiment, the current path is wider than in the first embodiment. Accordingly, compared to the first embodiment, the ON resistance (Ron) can be reduced. Furthermore, in this example, the width 16 of the n-type region 14 extends from the bonding interface 25 toward the n⁺-type substrate 10 side. In other words, the n-type region 14 forms a substantially trapezoidal shape. With this structure, the corners 23 at which focusing of the electrical field occurs are farther from the corners 43 than the corners 23 in the first embodiment. Accordingly, the withstand voltage of the active region 110 is improved.

Figure 7:
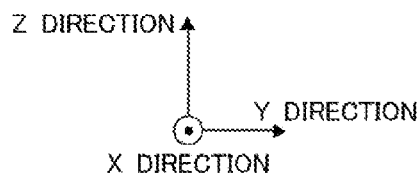
FIG. 7 shows a modification of the third embodiment.
Figure 7:
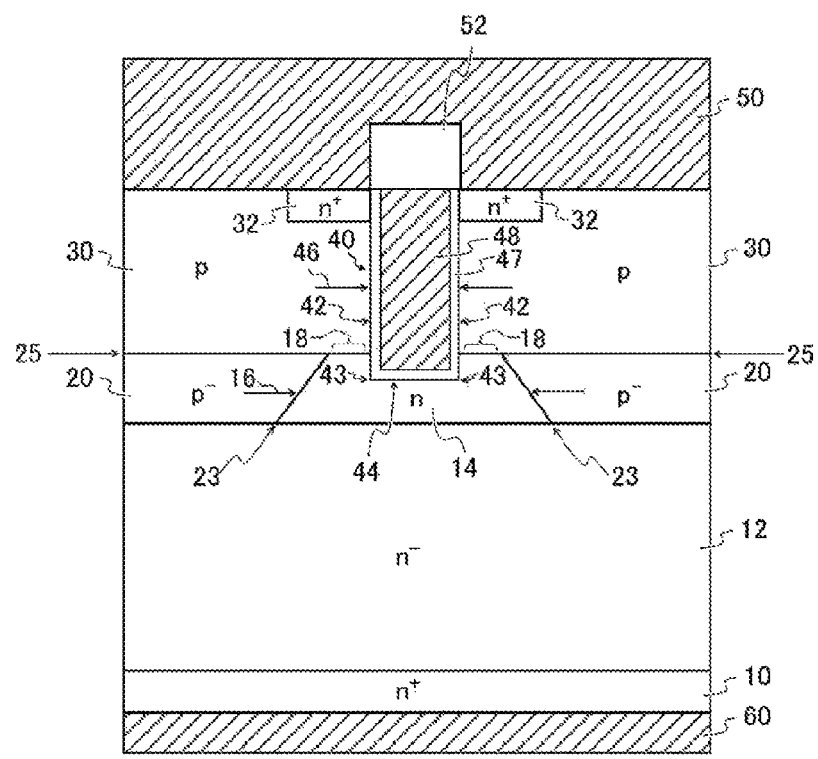

FIG. 7 shows a modification of the third embodiment. The n-type region 14 in this example includes a top portion 18 that extends along the bonding interface 25. In this example, compared to the third embodiment, the ON resistance (Ron) can be further reduced. In addition to this, the corners corner 23 are farther from the corners 43 than the corners 23 of the first embodiment, and therefore the withstand voltage can be further improved.

Figure 8:
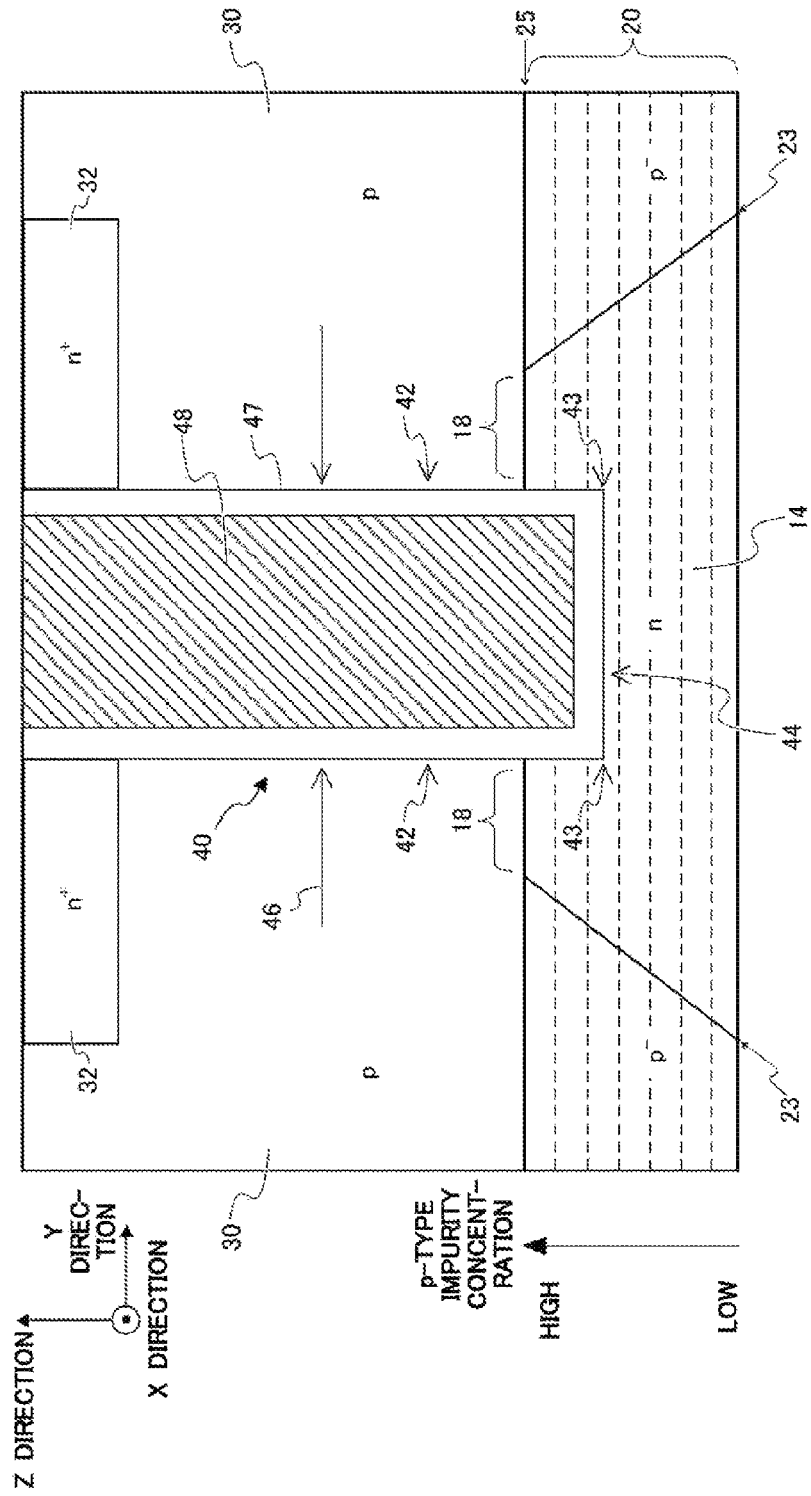
FIG. 8 is an enlarged view of the $p^-$-type region 20 and the p-type region 30 in FIG. 7.

FIG. 8 is an enlarged view of the $p^-$-type region 20 and the p-type region 30 in FIG. 7. In the $p^-$-type region 20, the p-type impurity concentration decreases from the bonding interface 25 toward the $n^+$-type substrate 10 side. In the $p^-$-type region 20 of this example, the p-type impurity concentration increases in a stepped manner in the +Z direction. The dotted lines indicate the change points of the p-type impurity concentration. For example, when epitaxially forming the $p^-$-type region 20, the flow rate of the p-type impurity raw material gas is increased in a stepped manner over time. As a result, the p-type impurity concentration increases in a stepped manner in the +Z direction. The p-type impurity concentration of the region closest to the bonding interface 25 in the $p^-$-type region 20 may have the same p-type impurity concentration as the $p^-$-type region 20 of the first embodiment.

The $p^-$-type region 20 formed in this manner is injected with n-type impurities at a higher concentration than in the first embodiment. In this case, the n-type impurities expand in the Y direction more easily than in the first embodiment, thereby forming the top portion 18 of the n-type region 14. In another example, the p-type impurity concentration may be increased continuously in the +Z direction by continuously increasing the flow rate of the p-type impurity raw material gas over time.

Figure 9:
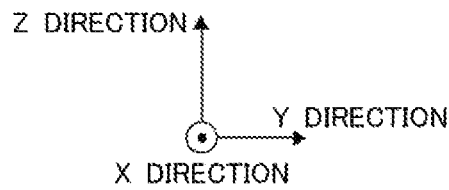
FIG. 9 shows a cross section of an active region 110 according to a fourth embodiment in the Y-Z plane.
Figure 9:
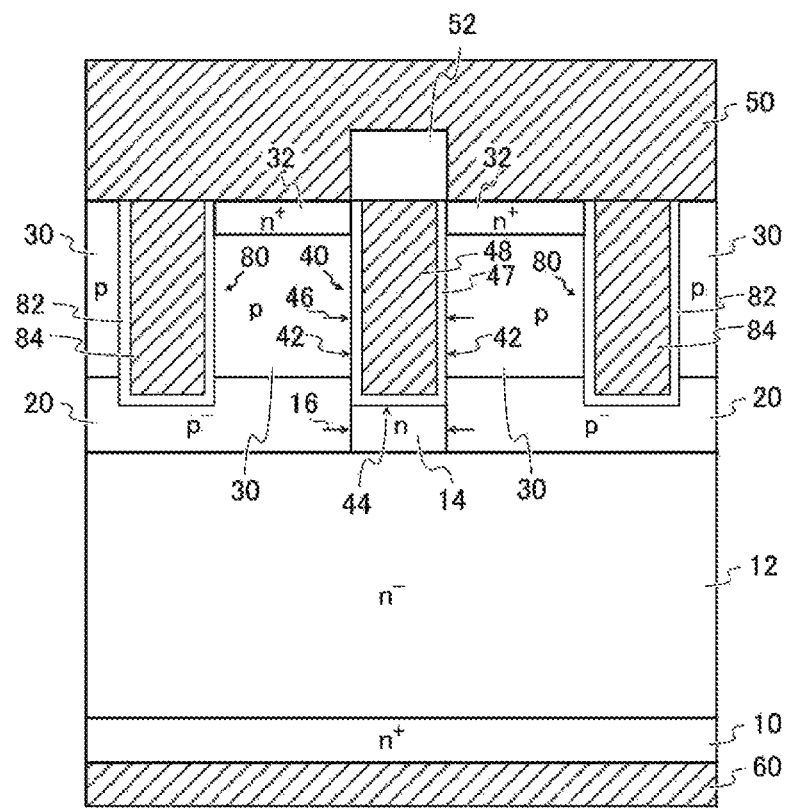

FIG. 9 shows a cross section of an active region 110 according to a fourth embodiment in the Y-Z plane. FIG. 9 shows a unit cell of the semiconductor device 100. The active region 110 of this example further includes a source trench 80. The source trench 80 penetrates through the p-type region 30 and is provided at a position differing from the position of the gate trench 40. The source trench 80 in this example may be created at a step that is the same as the step (S30) for forming the gate trench 40. The source trench 80 includes a $p^+$-type region 82 and electrode material 84 provided in contact with the $p^+$-type region 82. The $p^+$-type region 82 may be formed by ion injection, or may be formed epitaxially. The electrode material 84 may be a layered body of Ti and Al, or may be polysilicon. The fourth embodiment differs from the first embodiment with regard to these points. Other points are the same as in the first embodiment.

The source trench 80 of this example functions as an electrode for extracting the avalanche current. In other words, the source trench 80 functions as an extraction electrode when a breakdown occurs and a large current flows from the drain electrode 60 to the source electrode 50. The source trench 80 is positioned further downward than the source region 32, and can therefore prevent the avalanche current from flowing through the source region 32. In this way, it is possible to prevent the breakdown current from flowing to the source region 32 and turning ON the parasitic PNP transistor.

Figure 10:
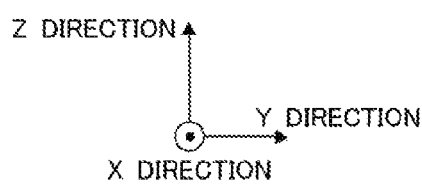
FIG. 10 shows a cross section of an active region 110 according to a fifth embodiment in the Y-Z plane.
Figure 10:
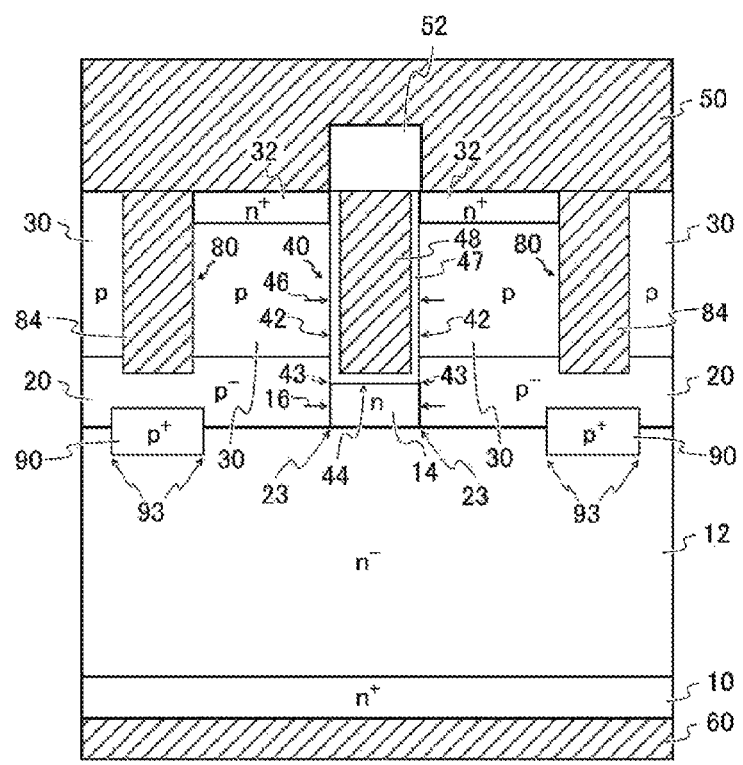

FIG. 10 shows a cross section of an active region 110 according to a fifth embodiment in the Y-Z plane. FIG. 10 shows a unit cell of the semiconductor device 100. The source trench 80 of this example does not include the $p^+$-type region 82 shown in FIG. 9. Furthermore, this example further includes an embedded region 90 below the source trench 80. The fifth embodiment differs from the fourth embodiment with regard to these points. Other points are the same as in the fourth embodiment.

The embedded region 90 is provided at a distance from the source trench 80 below the source trench 80. The embedded region 90 can be formed by forming the source trench 80 that does not include the electrode material 84 and then injecting p-type impurities through the source trench 80. At this time, by suitably adjusting the injection acceleration voltage, it is possible to inject p-type impurities into only the region near the boundary plane between the $p^-$-type region 20 and the $n^-$-type region 12. The embedded region 90 may have a higher p-type impurity concentration than the p-type region 30. The embedded region 90 of this example has $p^+$-type impurities.

The corners 93 of the p-n junction in the embedded region 90 break down more easily than the corners 23 of the n-type region 14. Since the embedded region 90 is arranged directly below the source trench 80, the avalanche current is extracted to the source trench 80 even more easily than in the fourth embodiment. Therefore, it is possible to more reliably prevent the breakdown current from flowing to the source region 32 and turning ON the parasitic PNP transistor. The shape of the active region 110 is not limited to the shape described above. The second or third embodiments may be combined with the fourth or fifth embodiments.

Figure 11:
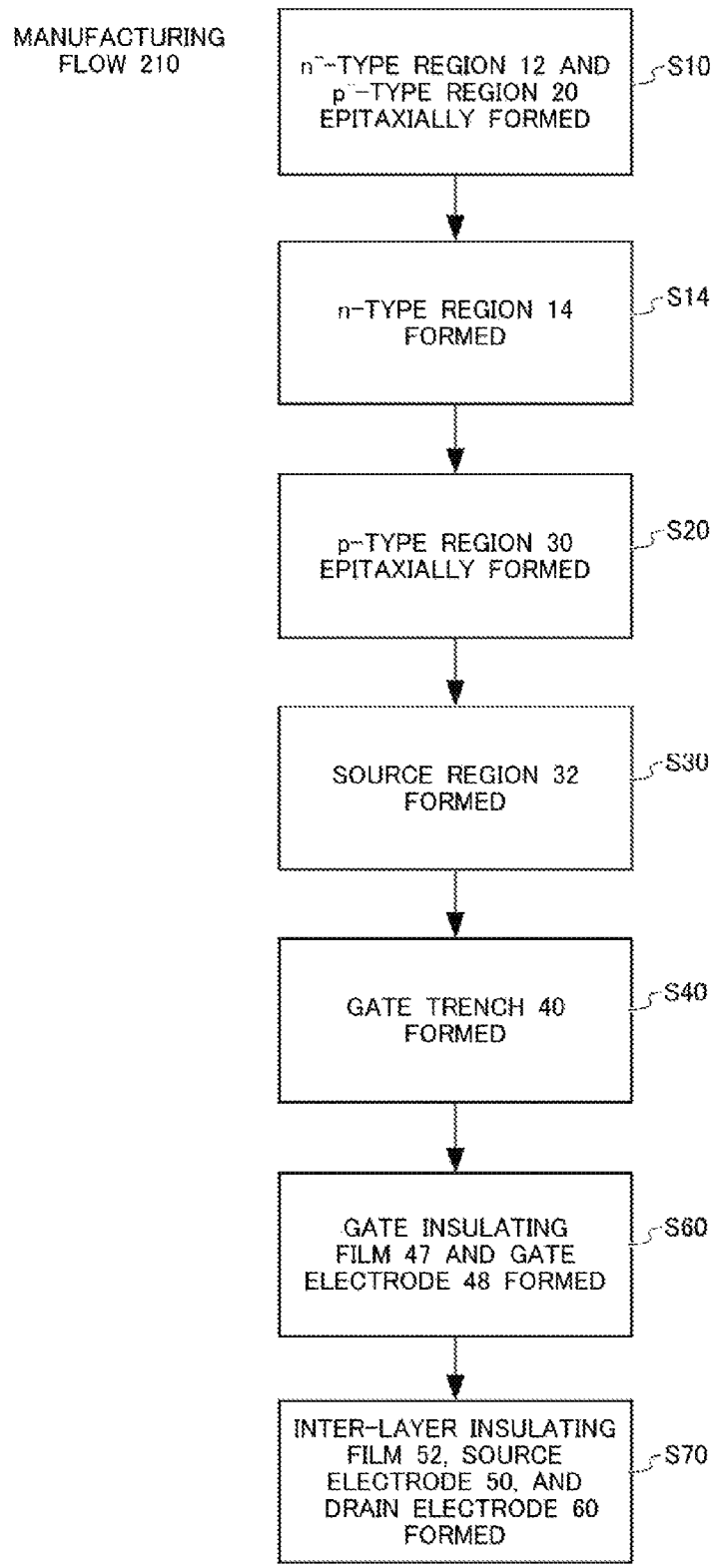
FIG. 11 shows a manufacturing flow 210 for manufacturing a semiconductor device 100 according to a sixth embodiment.

FIG. 11 shows a manufacturing flow 210 for manufacturing a semiconductor device 100 according to a sixth embodiment. In this example, a step (S14) for forming the n-type region 14 is included before the step (S20) for forming the p-type region 30. Other points are the same as in the first embodiment.

Figure 12A:
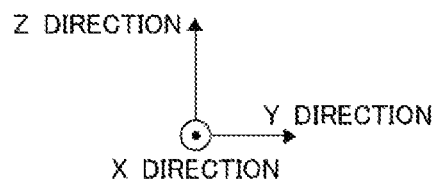
FIG. 12A shows the step (S14) for forming the n-type region 14.
Figure 12A:
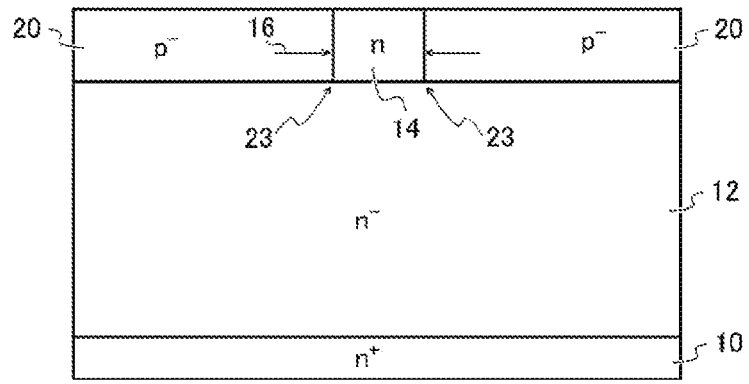

FIG. 12A shows the step (S14) for forming the n-type region 14. In this example, after the step (S10) for forming the $p^-$-type region 20, n-type impurities are ion-injected into a portion of the $p^-$-type region 20. Next, the n-type impurities are activated by performing thermal processing at a temperature of 1,300° C. or less. In this way, the n-type region 14 is formed.

Figure 12B:
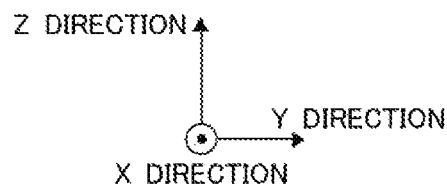
FIG. 12B shows the step (S20) for forming the p-type region 30.
Figure 12B:
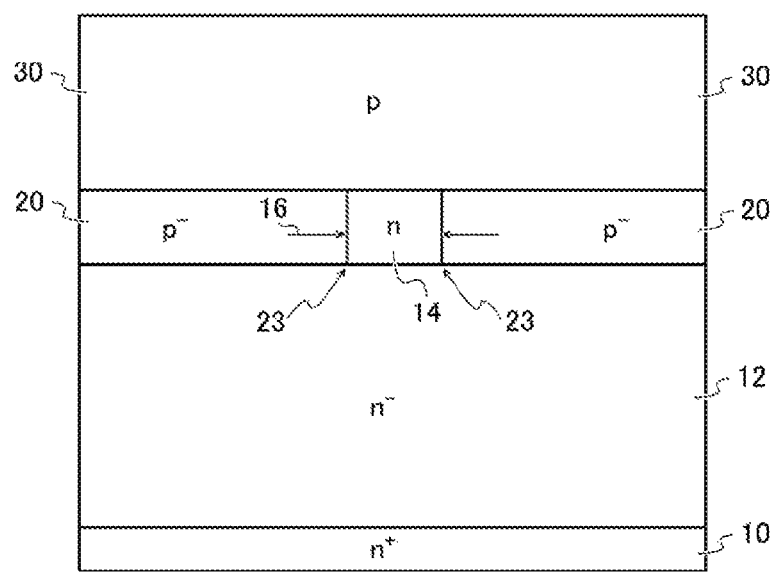
Figure 12C:
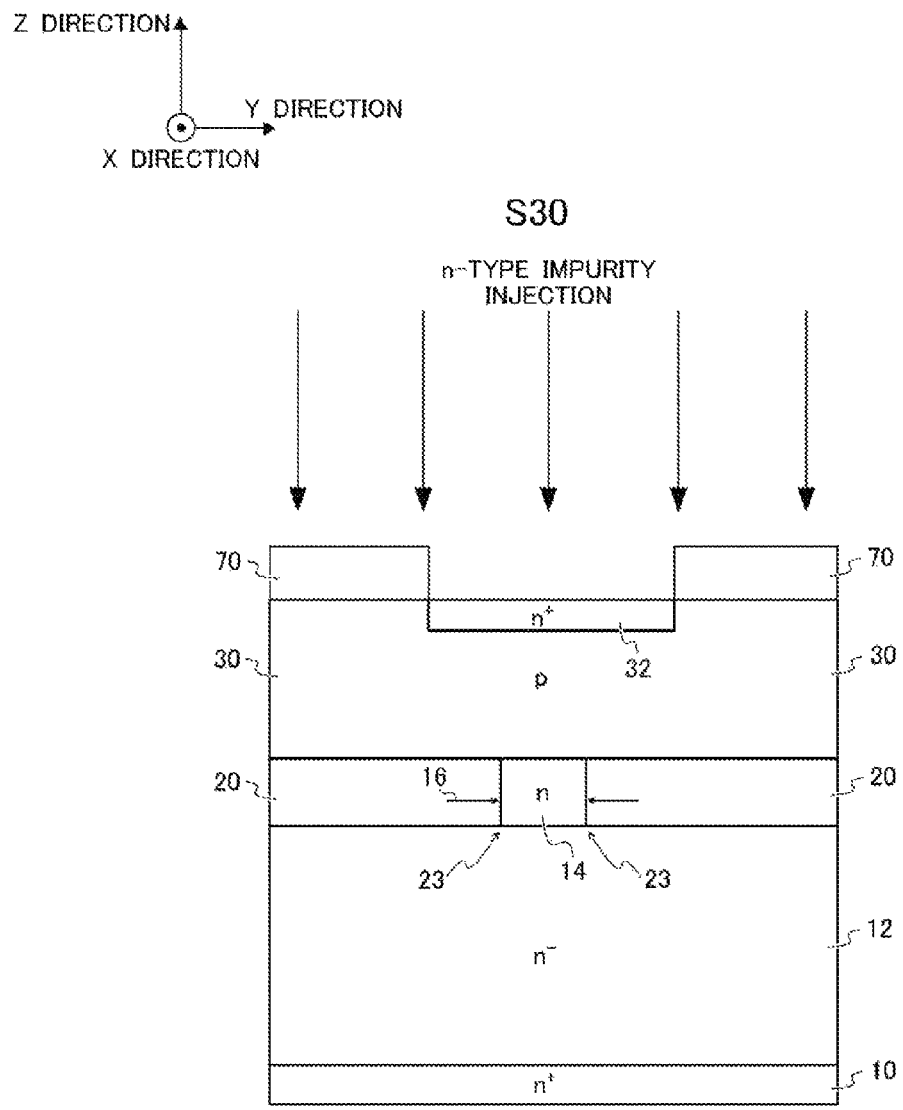
FIG. 12C shows the step (S30) for forming the source region 32.
Figure 12D:
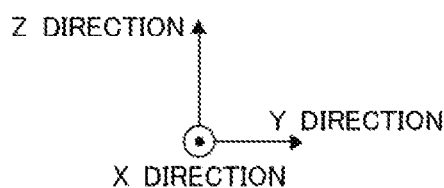
FIG. 12D shows the step (S40) for forming the gate trench 40.
Figure 12D:
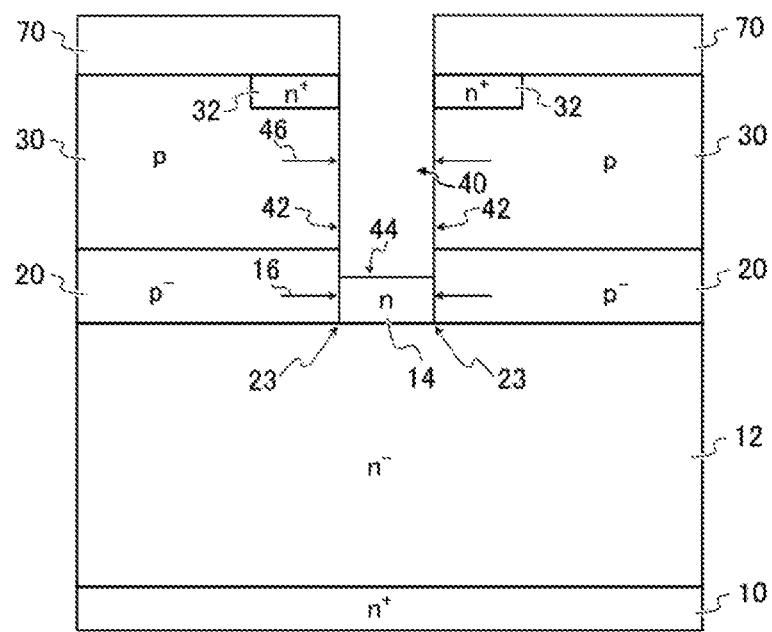

FIG. 12B shows the step (S20) for forming the p-type region 30. The p-type region 30 is formed in the same manner as in the first embodiment. FIG. 12C shows the step (S30) for forming the source region 32. The source region 32 is formed in the same manner as in the first embodiment. FIG. 12D shows the step (S40) for forming the gate trench 40. The gate trench 40 is formed in a manner to reach the $p^-$-type region 20, in the same manner as in the first embodiment. However, ion injection is not performed through the gate trench 40. After this, the step (S60) and the step (S70) of the first embodiment are performed sequentially.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: n$^+$-type substrate, 12: n$^-$-type region, 14: n-type region, 16: width, 18: top, 20: p$^-$-type region, 23: corner, 25: bonding interface, 30: p-type region, 32: source region, 40: gate trench, 42: side wall, 43: corner, 44: bottom portion, 46: width, 47: gate insulating film, 48: gate electrode, 50: source electrode, 52: inter-layer insulating film, 60: drain electrode, 70: mask material, 80: source trench, 82: p$^+$-type region, 84: electrode material, 90: embedded region, 93: corner, 100: semiconductor device, 110: active region, 112: gate pad, 114: source pad, 120: peripheral region, 200: manufacturing flow, 210: manufacturing flow

What is claimed is:

1. A semiconductor device comprising:
   a semiconductor substrate;
   a second semiconductor region with a second conduction type that is provided above the semiconductor substrate and includes a first semiconductor region with a first conduction type in a portion thereof;
   a third semiconductor region that is provided above the second semiconductor region and has a higher second conduction type impurity concentration than the second semiconductor region; and
   a gate trench that penetrates through the third semiconductor region and is provided on top of the first semiconductor region, wherein
   the gate trench includes a gate insulating film provided on side walls and a bottom portion of the gate trench and a gate electrode provided in contact with the gate insulating film,
   the bottom portion of the gate trench is provided in direct contact with the first semiconductor region,
   the width of the first semiconductor region extends from a bonding interface between the second semiconductor region and the third semiconductor region toward the semiconductor substrate side,
   the bottom portion of the gate trench is provided lower than a bonding interface between the second semiconductor region and the third semiconductor region, and
   the first semiconductor region has a portion that contacts the side walls of the gate trench, and
   in the second semiconductor region, the second conduction type impurity concentration decreases from the bonding interface toward the semiconductor substrate side.

2. The semiconductor device according to claim 1, wherein
   width of the gate trench is less than width of the first semiconductor region.

3. The semiconductor device according to claim 1, wherein
   the first semiconductor region has a top portion that extends along the bonding interface.

4. The semiconductor device according to claim 1, further comprising:
   a source trench that penetrates through the third semiconductor region, is provided at a position differing from a position of the gate trench, and includes electrode material.

5. The semiconductor device according to claim 4, further comprising:
   a fourth semiconductor region with a first conduction type, between the substrate and the second semiconductor region; and
   an embedded region that is provided at a distance from the source trench below the source trench, has a second conduction type impurity concentration that is higher than a second conduction type impurity concentration of the third semiconductor region, and is formed such that it straddles a boundary between the second semiconductor region and the fourth semiconductor region.

6. The semiconductor device according to claim 1, wherein
   the semiconductor substrate is either a silicon carbide or nitride semiconductor.

7. The semiconductor device according to claim 1, wherein
   the semiconductor device is used as a power semiconductor device with high withstand voltage.

8. A semiconductor device manufacturing method comprising:
   epitaxially forming a second semiconductor region with a second conduction type on a semiconductor substrate;
   epitaxially forming, on top of the second semiconductor region, a third semiconductor region that has a higher second conduction type impurity concentration than the second semiconductor region; and
   forming a gate trench that penetrates through the third semiconductor region;
   forming a first semiconductor region with a first conduction type in a portion of the second semiconductor region; and
   forming a gate insulating film on side walls and a bottom portion of the gate trench and forming a gate electrode in contact with the gate insulating film,
   wherein
   the bottom portion of the gate trench is provided in direct contact with the first semiconductor region,
   the width of the first semiconductor region extends from a bonding interface between the second semiconductor region and the third semiconductor region toward the semiconductor substrate side,
   the bottom portion of the gate trench is provided lower than a bonding interface between the second semiconductor region and the third semiconductor region, and
   the first semiconductor region has a portion that contacts the side walls of the gate trench, and
   in the second semiconductor region, the second conduction type impurity concentration decreases from the bonding interface toward the semiconductor substrate side.

9. The semiconductor device manufacturing method according to claim 8, wherein
   the forming the first semiconductor region includes forming the first semiconductor region by injecting impurities with the first conduction type into the portion of the second semiconductor region.

10. The semiconductor device manufacturing method according to claim 8, wherein
    the first semiconductor region is formed after forming the gate trench, and
    forming the first semiconductor region includes forming the first semiconductor region with the first conduction type in the portion of the second semiconductor region through the gate trench.

* * * * *